US012599003B2

(12) United States Patent
Chang et al.

(10) Patent No.: US 12,599,003 B2
(45) Date of Patent: Apr. 7, 2026

(54) MANUFACTURING METHOD OF PACKAGE SUBSTRATE

(71) Applicant: AaltoSemi Inc., Nanjing City (CN)

(72) Inventors: Andrew C. Chang, Nanjing City (CN);
Min-Yao Chen, Nanjing City (CN);
Sung-Kun Lin, Nanjing City (CN)

(73) Assignee: AaltoSemi Inc., Nanjing City (CN)

( * ) Notice: Subject to any disclaimer, the term of this patent is extended or adjusted under 35 U.S.C. 154(b) by 392 days.

(21) Appl. No.: 18/319,187

(22) Filed: May 17, 2023

(65) Prior Publication Data

US 2024/0021438 A1     Jan. 18, 2024

(30) Foreign Application Priority Data

Jul. 18, 2022    (TW) .................................. 111126888

(51) Int. Cl.
*H01L 21/3213*     (2006.01)
*H01L 21/48*     (2006.01)

(52) U.S. Cl.
CPC ................................ *H01L 21/4857* (2013.01)

(58) Field of Classification Search
CPC ....................... H01L 21/31144; H01L 21/3213
See application file for complete search history.

(56) References Cited

U.S. PATENT DOCUMENTS

2018/0092219 A1 *    3/2018    Chiu ..................... H05K 3/4647
2023/0066968 A1 *    3/2023    Huang .................. H01L 21/568
2024/0429356 A1 *    12/2024    Zhou ................... H01L 25/0753

* cited by examiner

*Primary Examiner* — Thomas T Pham
(74) *Attorney, Agent, or Firm* — Dority & Manning, PA

(57) ABSTRACT

A manufacturing method of a package substrate is provided, the manufacturing method includes forming a first circuit layer on a first metal layer; forming a dielectric layer on the first metal layer and the first circuit layer; forming a second metal layer on the dielectric layer; forming a plurality of conductive blind vias in the dielectric layer and forming a second circuit layer on the second metal layer, where the plurality of conductive blind vias are electrically connected to the first circuit layer and the second circuit layer; and removing the first metal layer and a portion of the second metal layer simultaneously. Therefore, in the manufacturing method, the first metal layer and the second metal layer can be removed by one etching process, such that the time for manufacturing the package substrate can be greatly reduced to increase production quantity.

6 Claims, 8 Drawing Sheets

MANUFACTURING METHOD OF PACKAGE SUBSTRATE

CROSS-REFERENCE TO RELATED APPLICATIONS

This application claims priority to Taiwan Patent Application No. 111126888, filed on Jul. 18, 2022. The entirety of the above-mentioned patent application is hereby incorporated by reference herein and made a part of this specification.

BACKGROUND

1. Technical Field

The present disclosure relates to a semiconductor packaging process, and more particularly, to a method for manufacturing a package substrate with embedded circuits.

2. Description of Related Art

In the early development of semiconductor packaging, the lead frame was used as a carrier for carrying active elements due to the lower manufacturing cost and higher reliability. However, with the vigorous development of the electronic industry, electronic products tend to be thinner and smaller in form, and are developing towards high performance, high function, and high speed in terms of function. Therefore, in order to meet the requirements of high integration and miniaturization in semiconductor devices, the lead frames are gradually replacing by package substrates with high-density and fine-pitch circuits in the current packaging process.

At present, there are various specifications of package substrates, such as embedded trace substrate (ETS), and a manufacturing method of the ETS is described as follows.

As shown in FIG. 1A, a copper foil substrate 1a is provided and comprises an insulating board body 10 and first copper layers 11 arranged on opposite sides of the insulating board body 10. Then, a first circuit layer 12 is formed on each of the first copper layers 11.

As shown in FIG. 1B, a dielectric layer 13 with a second copper layer 14 is laminated on the first copper layer 11 and the first circuit layer 12, so that the second copper layer 14 is exposed from one side.

As shown in FIG. 1C, a second circuit layer 15 is formed on the second copper layer 14, and a plurality of conductive blind vias 16 are formed in the dielectric layer 13 to electrically connect the first circuit layer 12 and the second circuit layer 15.

As shown in FIG. 1D, the exposed second copper layer 14 is etched to expose the dielectric layer 13, and the second copper layer 14 under the second circuit layer 15 is retained, so that the second circuit layer 15 and the second copper layer 14 form a circuit structure.

As shown in FIG. 1E, a protection layer 17 is formed on the dielectric layer 13 to cover the second copper layer 14 and the second circuit layer 15.

As shown in FIG. 1F, the insulating board body 10 is removed.

As shown in FIG. 1G, the first copper layer 11 is entirely etched to expose the first circuit layer 12 from the dielectric layer 13.

As shown in FIG. 1H, the protection layer 17 is removed to obtain a package substrate 1.

However, in the manufacturing method of the conventional package substrate 1, before removing the insulating board body 10, a first etching process needs to be performed to remove the second copper layer 14, and after removing the insulating board body 10, a second etching process is then performed to remove the first copper layer 11. Therefore, the manufacturing method of the conventional package substrate 1 requires two etching processes to remove the first copper layer 11 and the second copper layer 14 respectively, such that the process time is lengthened, which leads to poor productivity.

Furthermore, since two etching processes are required, the protection layer 17 needs to be formed to protect the second circuit layer 15 before the second etching process, and thus increasing the material cost of the protection layer 17, such that the production cost of the package substrate 1 is difficult to reduce.

Therefore, there is a need for a solution that addresses the aforementioned shortcomings of the prior art.

SUMMARY

In view of the aforementioned shortcomings of the prior art, the present disclosure provides a method of manufacturing a package substrate, the method comprises: forming a first circuit layer on a first metal layer; forming a dielectric layer on the first metal layer and the first circuit layer; forming a second metal layer on the dielectric layer; forming a plurality of conductive blind vias in the dielectric layer and forming a second circuit layer on the second metal layer, wherein the plurality of conductive blind vias are electrically connected to the first circuit layer and the second circuit layer; and removing the first metal layer and a portion of the second metal layer simultaneously.

In the aforementioned method, the first metal layer is bonded on at least one side of an insulating board body, such that the first metal layer and the insulating board body form a carrier board. For example, the carrier board is a copper foil substrate. Further, the method comprises removing the insulating board body before simultaneously removing the first metal layer and the portion of the second metal layer.

In the aforementioned method, the first metal layer comprises copper.

In the aforementioned method, the first metal layer and the portion of the second metal layer are removed simultaneously by etching.

In the aforementioned method, a thickness of the second metal layer is less than or equal to a thickness of the first metal layer.

In the aforementioned method, the second metal layer comprises copper.

As can be understood from the above, in the manufacturing method of the package substrate according to the present disclosure, the package substrate is obtained by removing the first metal layer and part of the second metal layer simultaneously. Therefore, compared with the prior art, the first metal layer and the second metal layer can be removed by performing merely one etching process in the present disclosure, so that the process time can be greatly reduced and the productivity can be increased.

Furthermore, the manufacturing method of the package substrate of the present disclosure removes the first metal layer and part of the second metal layer simultaneously, and thus etching part of the material of the second circuit layer. Therefore, there is no need to form a conventional protection layer to protect the second circuit layer, which can thus save the material cost of the protection layer, and thereby reducing the manufacturing cost of the package substrate.

DETAILED DESCRIPTION

Figure 1A:
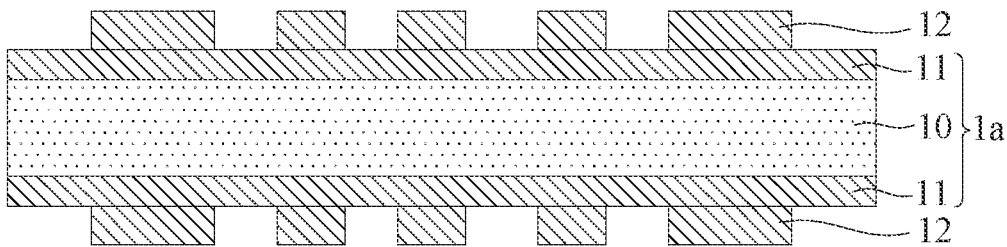
FIG. 1A to FIG. 1H are schematic cross-sectional views illustrating a method of manufacturing a conventional package substrate.
Figure 1B:
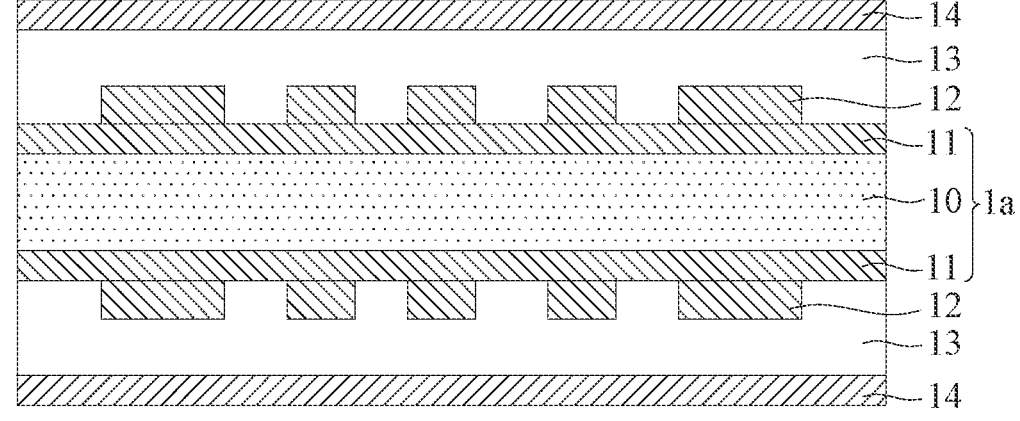
Figure 1C:
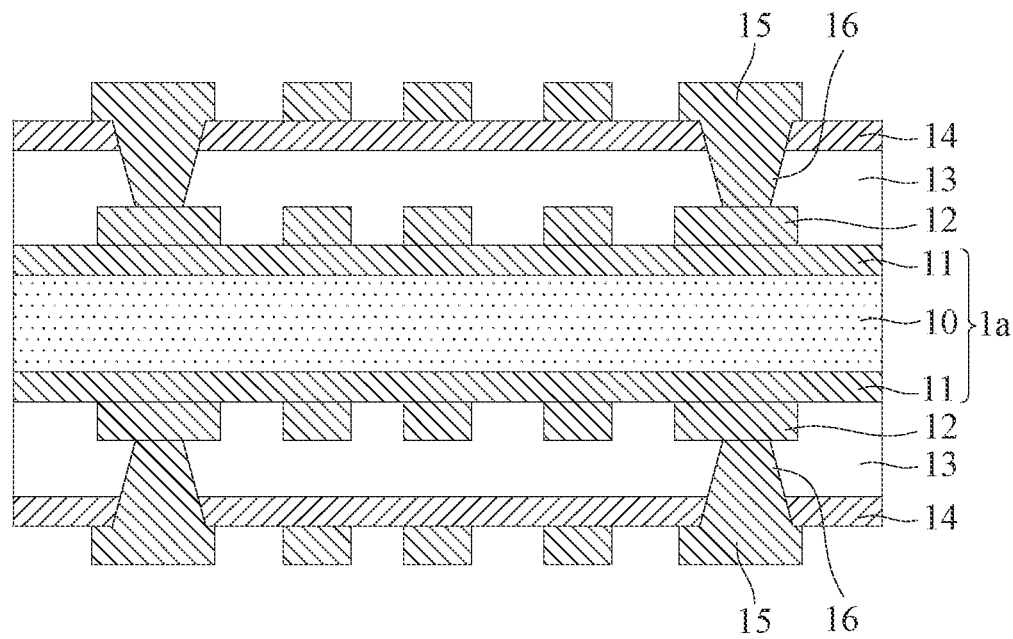
Figure 1D:
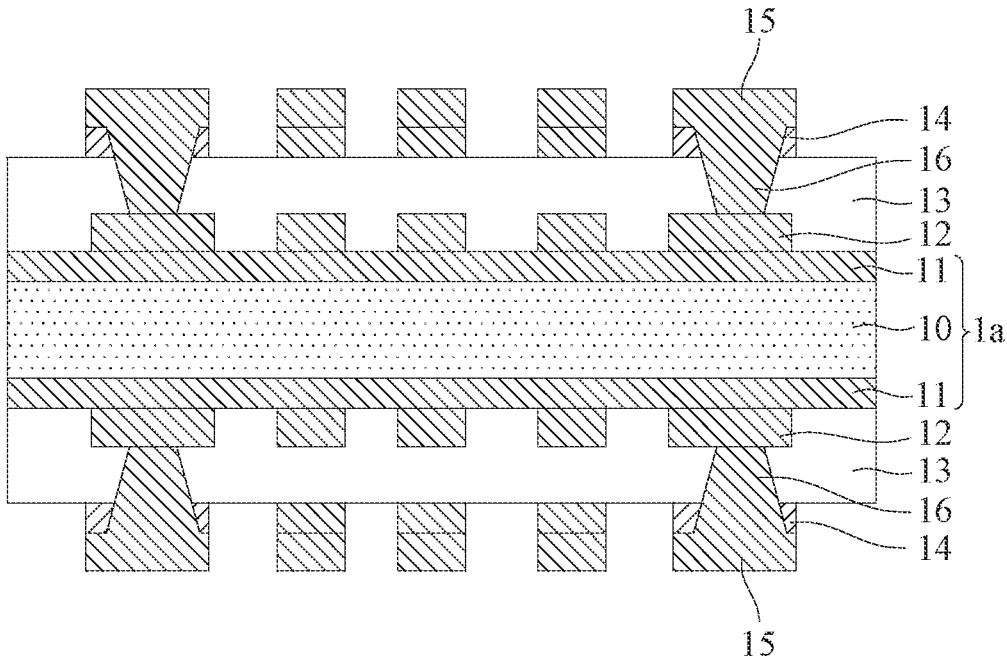
Figure 1E:
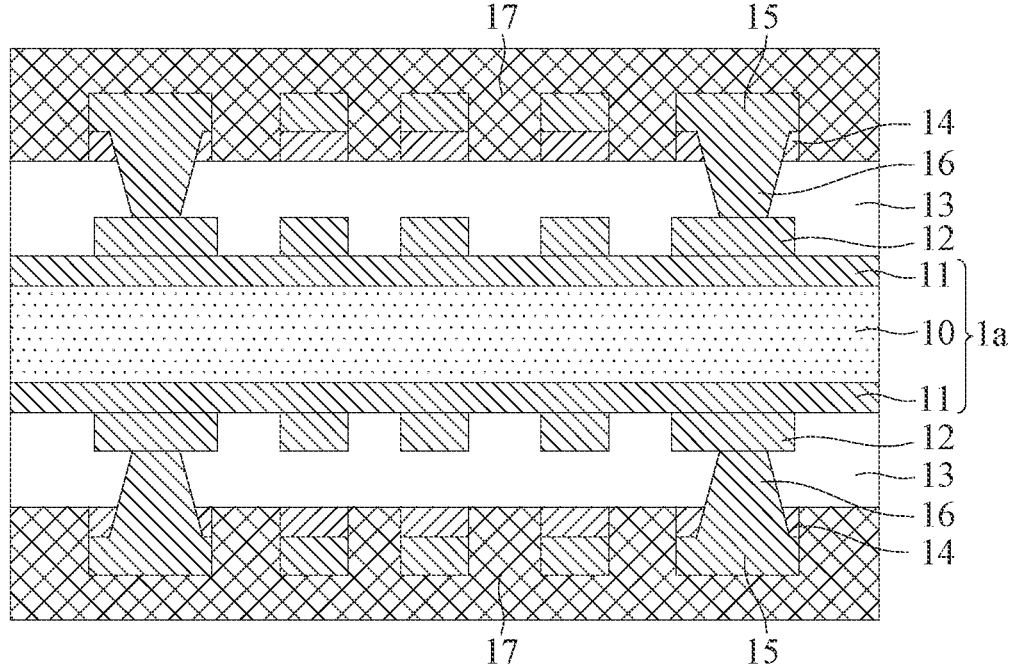
Figure 1F:
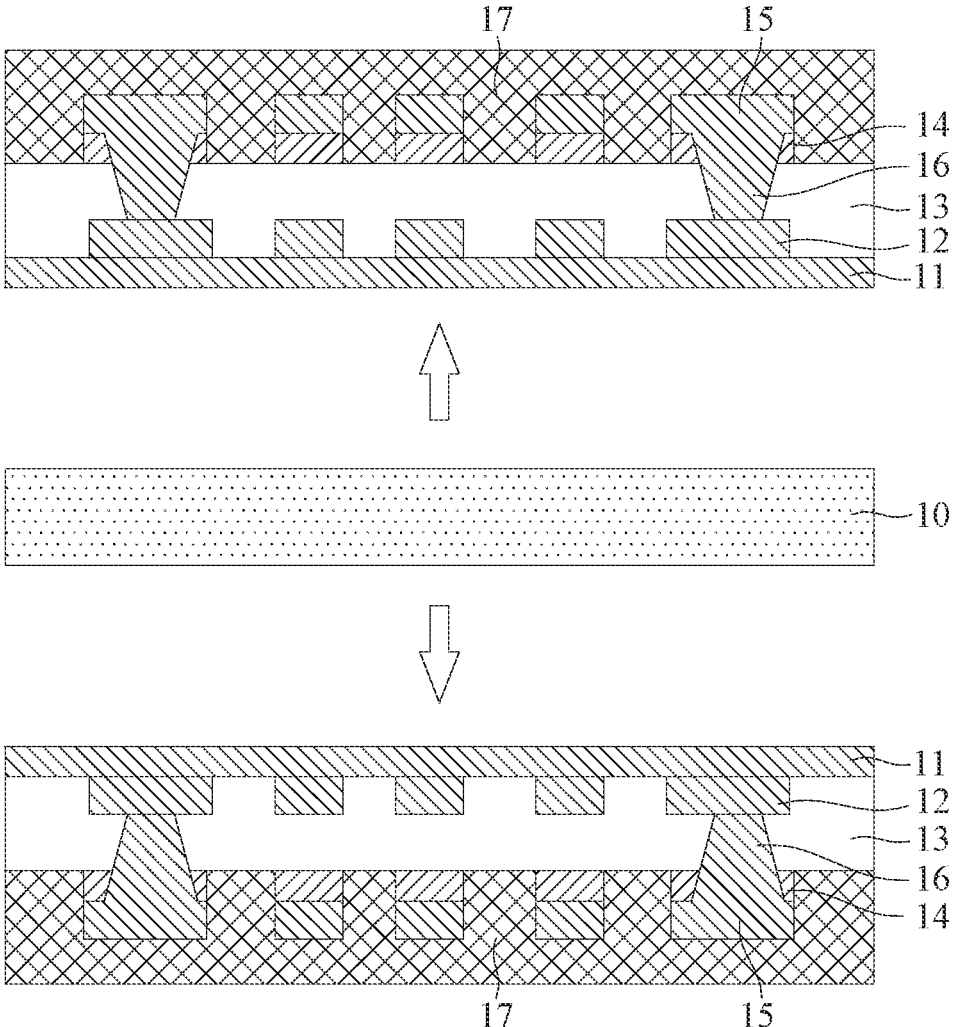
Figure 1G:
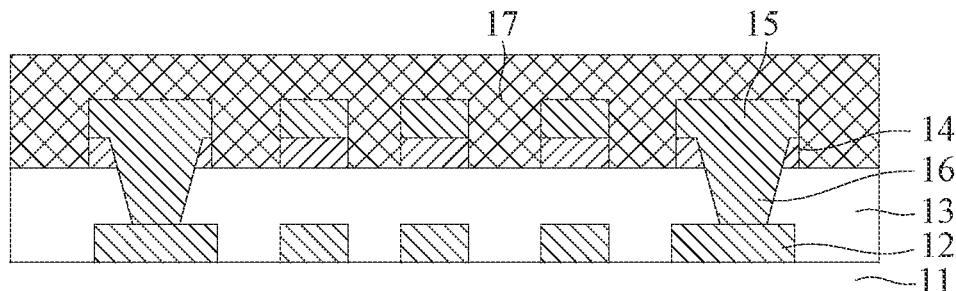
Figure 1H:
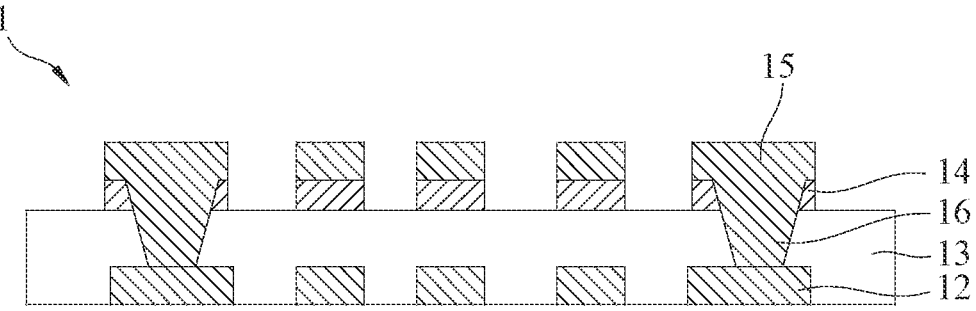

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios, or sizes are construed as falling within the scope covered by the technical contents disclosed herein. Meanwhile, terms such as "on," "above," "below," "first," "second," "a," "one," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A to FIG. 2E are schematic cross-sectional views illustrating a method of manufacturing a package substrate 2 according to the present disclosure.

Figure 2A:
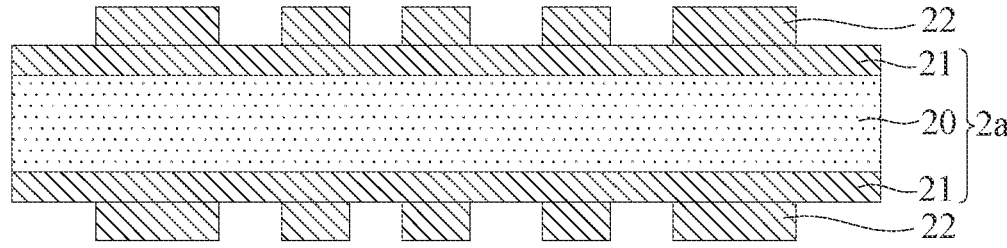
FIG. 2A to FIG. 2E are schematic cross-sectional views illustrating a method of manufacturing a package substrate according to the present disclosure.

As shown in FIG. 2A, a carrier board 2a is provided, and then a patterned wiring process is performed to form a first circuit layer 22 on the carrier board 2a.

In an embodiment, the carrier board 2a is a copper foil substrate and comprises an insulating board body 20 and first metal layers 21 (i.e., copper foils) respectively formed on opposite sides of the insulating board body 20. It should be understood that the carrier board 2a is made of a consumable material, so in other embodiments, carrier boards with other specifications can be selected as the carrier board 2a according to requirements.

Furthermore, in an embodiment, the carrier board 2a is a double-sided symmetrical structure, and the manufacturing process can be carried out on each of the first metal layers 21, so the manufacturing processes on the opposite sides of the carrier board 2a are the same in the embodiment. Therefore, only the manufacturing processes on one side of the insulating board body 20 are described below, and the manufacturing processes on the other side of the insulating board body 20 will not be repeated.

Also, the material forming the insulating board body 20 can be selected from such as Ajinomoto build-up film (ABF), polyvinyl ether (PPE), polytetrafluoroethylene (PTFE), flame resistant/retardant 4 (FR-4), FR-5, bismaleimide triazine (BT), liquid crystal polymer, benzocyclobutene (BCB), polyimide (PI), aramide, epoxy resin and glass fiber and other photosensitive or non-photosensitive organic resin materials, but the present disclosure is not limited to the above.

In addition, the first metal layer 21 is used as a seed layer to form the first circuit layer 22 by for example an electroplating method.

Figure 2B:
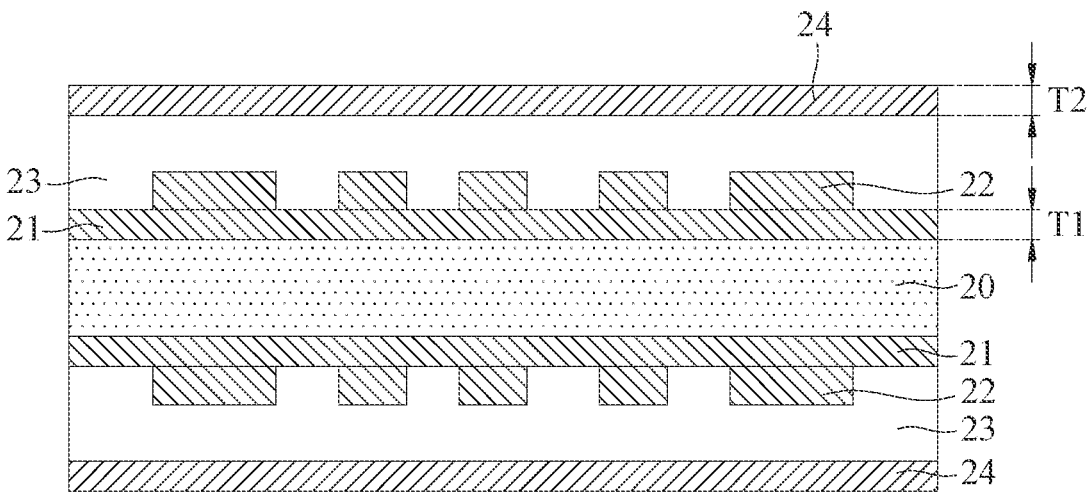

As shown in FIG. 2B, a dielectric layer 23 is formed on the first metal layer 21 and the first circuit layer 22, and a second metal layer 24 is formed on the dielectric layer 23.

In an embodiment, the material of the dielectric layer 23 can be selected from dielectric materials such as prepreg (PP), Ajinomoto build-up film (ABF), photoimageable dielectric (PID), or polyimide (PI), but the present disclosure is not limited to the above-mentioned types of materials. Further, the dielectric layer 23 can be formed on the first metal layer 21 and the first circuit layer 22 by lamination, coating, or other suitable processes.

Furthermore, the second metal layer 24 can be formed by chemical precipitation, electroless plating, physical vapor deposition, chemical vapor deposition, sputtering, etc. Alternatively, the second metal layer 24 can be copper foil and is formed on the dielectric layer 23 first, and then the dielectric layer 23 is laminated on the first metal layer 21 and the first circuit layer 22.

Also, based on the requirements of the subsequent etching process, a thickness T2 of the second metal layer 24 is equal to a thickness T1 of the first metal layer 21. It should be understood that the thickness T2 of the second metal layer 24 can be formed less or greater than the thickness T1 of the first metal layer 21 according to the requirements of the aspect of the circuit after etching.

Figure 2C:
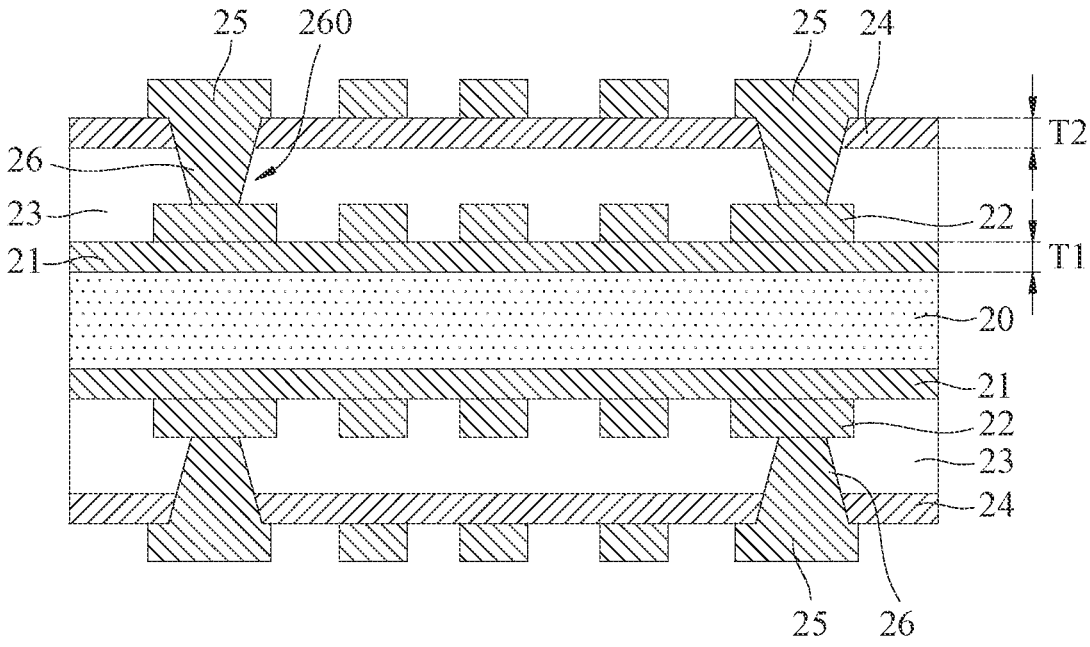

As shown in FIG. 2C, a second circuit layer 25 is formed on the second metal layer 24, and a plurality of conductive blind vias 26 are formed in the dielectric layer 23, so that the conductive blind vias 26 are electrically connected to the first circuit layer 22 and the second circuit layer 25.

In an embodiment, the conductive blind vias 26 and the second circuit layer 25 are integrally formed, such as by one electroplating process. For example, in the manufacturing process of the conductive blind vias 26, technology such as laser or mechanical drilling can first be used to penetrate through the second metal layer 24 and extend to the first circuit layer 22 so as to form blind vias 260, so that the blind vias 260 expose the first circuit layer 22. Then, the second metal layer 24 is used as a seed layer, and a conductive material is formed in the blind vias 260 and on the dielectric layer 23 by electroplating, chemical precipitation, or other methods so as to form the conductive blind vias 26 and the second circuit layer 25.

In other embodiments, the conductive blind vias 26 and the second circuit layer 25 may be fabricated separately. For example, metal pillars such as copper pillar structures are formed on the first circuit layer 22 first to serve as the conductive blind vias 26, and then the second circuit layer 25 is formed on the dielectric layer 23.

Figure 2D:
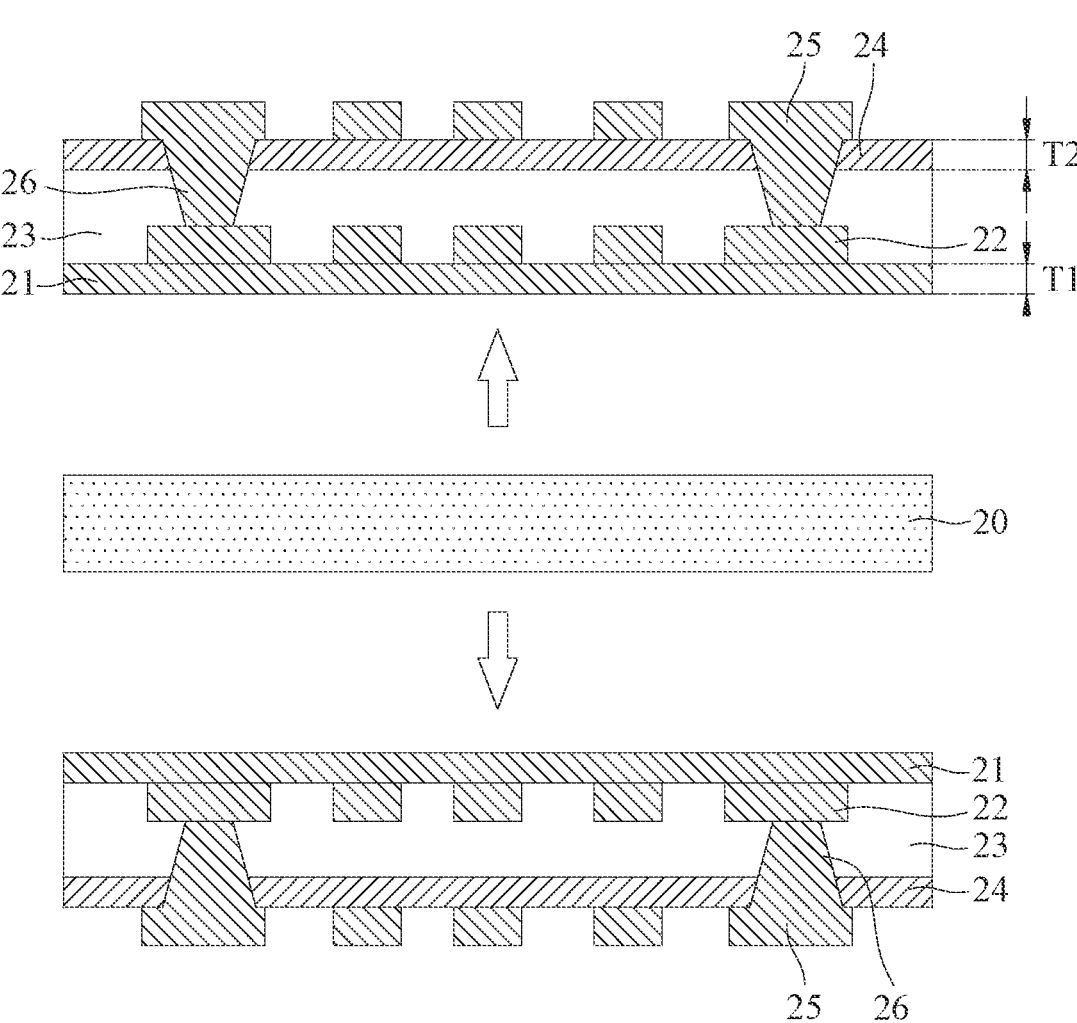

As shown in FIG. 2D, the insulating board body 20 is removed to expose the first metal layer 21.

Figure 2E:
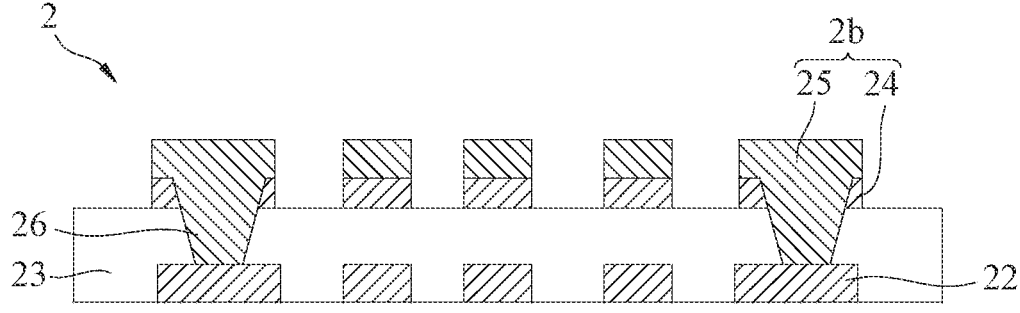

As shown in FIG. 2E, the exposed first metal layer 21 and part of the second metal layer 24 are removed simultaneously to obtain the package substrate 2, wherein the first circuit layer 22 of the package substrate 2 is embedded in the dielectric layer 23.

In an embodiment, the exposed first metal layer 21 and part of the second metal layer 24 are removed by etching, so part of the material of the second circuit layer 25 are removed, but the second metal layer 24 under the second circuit layer 25 is not removed, so that the second circuit layer 25 and the second metal layer 24 below the second circuit layer 25 are served as a circuit structure 2b. For example, the thickness T2 of the second metal layer 24 is equal to the thickness T1 of the first metal layer 21, so the first circuit layer 22 is not slightly etched after removing the exposed first metal layer 21 and the second metal layer 24, such that a surface of the first circuit layer 22 is flush with a surface of the dielectric layer 23. Alternatively, if the thickness T2 of the second metal layer 24 is less than the thickness T1 of the first metal layer 21, part of the material of the second circuit layer 25 will be further removed (but the circuit structure 2b will not be completely removed) before completely removing the first metal layer 21.

It should be understood that if the thickness T2 of the second metal layer 24 is greater than the thickness T1 of the first metal layer 21, the first metal layer 21 and part of the material of the first circuit layer 22 will be removed successively before the second metal layer 24 is completely removed, such that the surface of the first circuit layer 22 will be recessed into the surface of the dielectric layer 23, but the first circuit layer 22 will not be completely removed.

In view of the above, in the manufacturing method of the package substrate 2 according to the present disclosure, the package substrate 2 is obtained by removing the insulating board body 20 first and then removing the first metal layer 21 and part of the second metal layer 24 simultaneously. Therefore, compared with the prior art, the first metal layer 21 and the second metal layer 24 can be removed by performing merely one etching process in the present disclosure, so that the process time can be greatly reduced and the productivity can be increased.

Furthermore, the manufacturing method of the package substrate 2 of the present disclosure removes the first metal layer 21 and part of the second metal layer 24 simultaneously, and thus etching part of the material of the second circuit layer 25. Therefore, there is no need to form a conventional protection layer to protect the second circuit layer 25, which can thus save the material cost of the protection layer, and thereby reducing the manufacturing cost of the package substrate 2.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A method of manufacturing a package substrate, comprising:

forming a first circuit layer directly on a first metal layer, wherein the first metal layer is bonded directly on at least one side of an insulating board body;

forming a dielectric layer on the first metal layer and the first circuit layer;

forming a second metal layer on the dielectric layer;

forming a plurality of conductive blind vias in the dielectric layer and forming a second circuit layer on the second metal layer, wherein the plurality of conductive blind vias are electrically connected to the first circuit layer and the second circuit layer;

removing the insulating board body; and after removing the insulating board body, removing the first metal layer and a portion of the second metal layer simultaneously by etching.

2. The method of claim 1, wherein the first metal layer and the insulating board body form a carrier board.

3. The method of claim 2, wherein the carrier board is a copper foil substrate.

4. The method of claim 1, wherein the first metal layer comprises copper.

5. The method of claim 1, wherein a thickness of the second metal layer is less than or equal to a thickness of the first metal layer.

6. The method of claim 1, wherein the second metal layer comprises copper.

* * * * *